(12) United States Patent
Micheloni et al.

(10) Patent No.: US 6,493,260 B2
(45) Date of Patent: Dec. 10, 2002

(54) NONVOLATILE MEMORY DEVICE, HAVING PARTS WITH DIFFERENT ACCESS TIME, RELIABILITY, AND CAPACITY

(75) Inventors: Rino Micheloni, Turate (IT); Giovanni Campardo, Bergamo (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/957,628

(22) Filed: Sep. 19, 2001

(65) Prior Publication Data

US 2002/0054504 A1 May 9, 2002

(30) Foreign Application Priority Data

Sep. 20, 2000 (EP) .............................................. 00830627

(51) Int. Cl.$^7$ ............................................... G11C 16/04
(52) U.S. Cl. .............................. 365/185.03; 365/185.11
(58) Field of Search ........................... 365/185.03, 168, 365/185.08, 45, 185.11

(56) References Cited

U.S. PATENT DOCUMENTS 5,262,984 A * 11/1993 Noguchi et al. ....... 365/185.03
5,541,886 A    7/1996 Hasbun ................ 365/230.01
5,838,610 A   11/1998 Hashimoto ................ 365/168
6,044,004 A    3/2000 Kramer ....................... 365/45

FOREIGN PATENT DOCUMENTS

EP    0 766 254 A2    4/1997
EP    0 788 113 A1    8/1997
EP    0 961 287 A1   12/1999

* cited by examiner

*Primary Examiner*—Huan Hoang
(74) *Attorney, Agent, or Firm*—Lisa K. Jorgenson; Dennis M. de Guzman; Seed IP Law Group PLLC

(57) ABSTRACT

The multilevel memory device has a memory section containing cells that can be programmed with a predetermined number of levels greater than two, i.e., a multilevel array, and a memory section containing cells that can be programmed with two levels, i.e., a bilevel array. The multilevel array is used for storing high-density data, for which speed of reading is not essential, for example for storing the operation code of the system including the memory device. On the other hand, the bilevel array is used for storing data for which high speed and reliability of reading is essential, such as the BIOS of personal computers, and the data to be stored in a cache memory. The circuitry parts dedicated to programming, writing of test instructions, and all the functions necessary for the operation of the memory device, can be common to both arrays.

27 Claims, 4 Drawing Sheets

NONVOLATILE MEMORY DEVICE, HAVING PARTS WITH DIFFERENT ACCESS TIME, RELIABILITY, AND CAPACITY

BACKGROUND OF THE INVENTION

1. Field of the Invention

The present invention relates to a memory device. The invention is applicable to a flash memory, and may also be used in any type of memory; for example, it can advantageously be applied to a nonvolatile memory, such as an EPROM, EEPROM, and other types of memories.

2. Description of the Related Art

As is known, multilevel flash memories allow storing more than one bit inside each memory cell. Thereby, the capacity (storage density) of the memory is increased, the dimensions of the memory are reduced, and the storing cost per megabit is reduced.

Currently commercially available multilevel memories have dimensions of up to 256 Mbits (memories with NAND configuration), and up to 128 Mbits (memory with NOR configuration). The currently used multilevel memories have 2 bits per cell, allowing the threshold voltage of the cell to be modified within four separate distributions, as shown in FIG. 1. Devices have been proposed, some of which are at the design stage, that can store 6 or more bits, corresponding to 64 or more separate distributions.

Despite the advantages associated with the greater data capacity, present multilevel flash memories have the problem that data reading is difficult. In particular, when the number of bits per cell is increased, the performances are correspondingly deteriorated, as regards to access time and reliability. In fact, the need to distinguish more distributions than bilevel devices, (which have only two storage slates) requires greater sensitivity of the reading system, which must be able to distinguish two currents differing for a few micro Amps, compared with the tens of micro Amps of bilevel cells. This results in a longer access time, irrespective of the adopted reading system, whether parallel or serial, of the current or threshold type. FIG. 2 shows for example the current distribution as a function of gate-source voltage of memory cells programmed with two bits, read using a current system with a constant gate voltage (Vr), wherein the two bits stored in a cell to be read are detected by comparing the current supplied by the cell to be read, with three current references Irif1, Irif2, Irif3.

Consequently, reading a multilevel cell is intrinsically slower than reading a bilevel cell, specifically because of the greater accuracy required during reading. For example, the access time for a bilevel, 32 Mbit flash memory is less than 80 ns, whereas the access time for a multilevel memory with the same dimensions, with two bits per cell, is approximately 120 ns.

Consequently, the advantage due to the reduction of dimensions and costs of multilevel memories is obtained at the expense of speed and reliability. This situation is particularly disadvantageous in case of memories designed to store both information, for which a high speed and reliability is required, and information, for which a high capacity is more important. This is the case, for example, of memories storing both device operating codes, and data.

It should be noted that multilevel devices produced specifically for reducing storage costs per Mbit are advantageous only for large memory reductions; in fact, the additional circuitry necessary for accomplishing the greater accuracy required for carrying out memory reading and programming reduces the efficiency $\eta_{ar}$ of the device defined as:

wherein $A_{cel}$ is the area occupied solely by the memory cells of the device, and $A_{dev}$ is the area occupied by the entire device.

With the present technologies, to obtain good efficiency, it is therefore necessary for the device to have dimensions of at least 64 Mbits. These devices are advantageous in particular for storing codes, which can be read sequentially and not randomly, for example by burst reading, which, at the expense of an initial delay known as latency, can subsequently reach reading speeds higher than 50 MHz. In this case, however, the data reading, which takes place randomly, is disadvantageous.

Another example of devices having conflicting requirements in different parts, are boot devices, which generally have a sector read directly when the system that includes the memory is switched on, such as for the BIOS of personal computers. In this case, it is important for the reading time to access the sector of the BIOS to be as short as possible, without however reducing the data storage capacity. The same applies to memory devices provided with an operative part such as a cache memory, for which a high reading speed is required, and with a part designed for storing large data or codes information.

SUMMARY OF THE INVENTION

According to principles of the present invention, a memory device allowing rapid, reliable reading of information stored in part of the memory, and yielding a high information storage density in another part of the memory is provided.

According to the present invention, a nonvolatile memory device is provided having a memory matrix with two portions, a first portion in which memory cells store M bits, and a second memory portion in which memory cells store N bits. The relative size of each portion can be established at manufacture or, preferably, a circuit is provided so that the relative size of each portion can be modified as selected by a user. For such a memory device, some of the memory access circuitry is common to both portions of the array, thus conserving space over having two separate memories. For example, the common portions may be the input and output pads. For increased savings in space, the common portions may also include one or more of the row decoder, the column decoder, the sense amplifier circuitry, the program and erase circuitry, and the input and output logic.

BRIEF DESCRIPTION OF THE DRAWINGS

In order to assist understanding of the present invention, preferred embodiments are now described, purely by way of non-limiting example, with reference to the attached drawings, wherein.

DETAILED DESCRIPTION OF THE INVENTION

Figure 1:
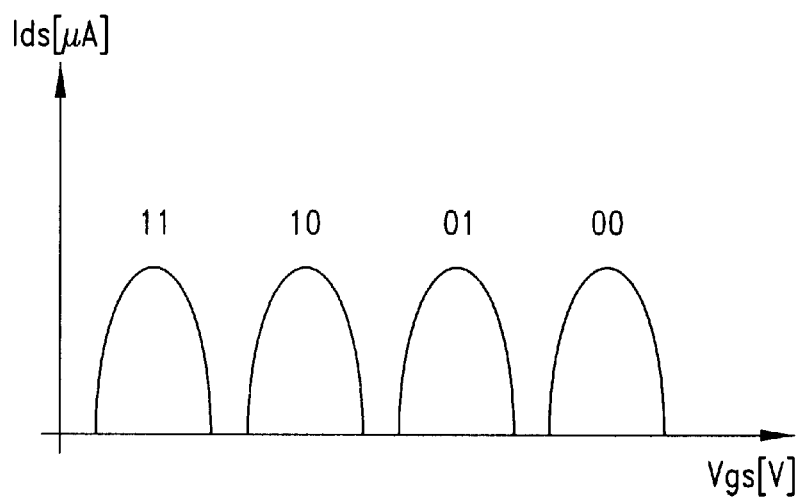
FIG. 1 shows the distributions conventionally used for storing two bits of information.
Figure 2:
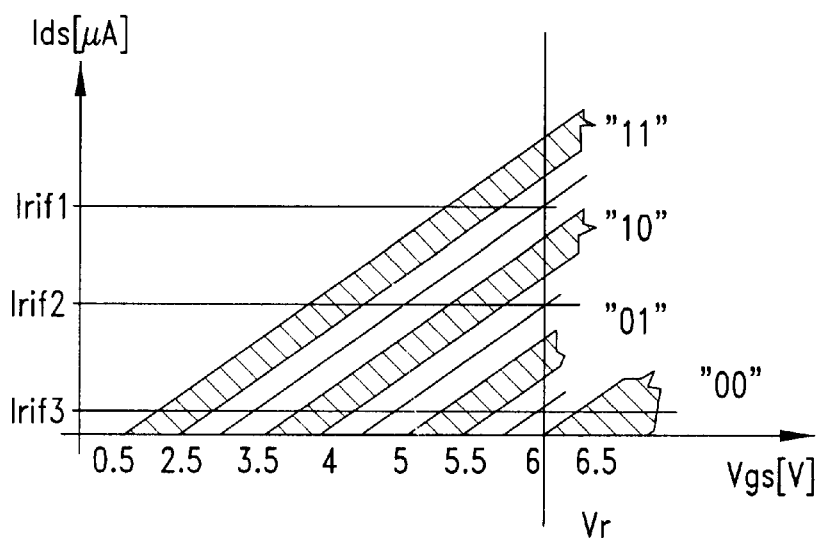
FIG. 2 shows a conventional current reading diagram of memory cells storing two bits.

According to the invention, a multilevel memory device has a variable storage capacity. In particular, the memory device comprises a first memory section containing cells that can be programmed with a first number of predetermined levels m, and a memory section containing cells that can be programmed with a second number of predetermined levels n, different from m. For example, if M is a number greater than two, the first memory section defines a multilevel array, and if N=2, the second memory section defines a bilevel array. The multilevel array is then used for storing high-density data, for which reading speed and reliability are less stringent requirements. On the other hand, the bilevel array is used for storing data, for which a high reading speed and reliability is more important, such as the BIOS of personal computers, instructions for device operation, or the data to be stored in the cache memory.

In the memory device according to the invention, the circuitry parts dedicated to programming, writing of test instructions, and all the functions necessary for the operation of the memory device, are common to both the arrays, for saving space in one embodiment. In an alternative embodiment, they can also be different. The memory cells programmed with only two different levels (bilevel cells) can be written using the same algorithm as that used for the cells storing several levels (multilevel cells), using only the maximum level and the minimum level, corresponding to writing all "0" bits and all "1" bits. Thereby, a single programming method may be used for both the multilevel and bilevel arrays, as a single reading method. As an alternative, programming of the bilevel memory portion can be performed by conventional bilevel circuits, or by some other technique than used for the multilevel memory, which simply write an "0" or a "1". The multilevel memory can be written to using conventional multilevel writing circuits, different from the bilevel. In some circuit configurations multilevel memory portion is written to using different techniques and circuits than for the bilevel memory portion. If this is to be the case for a memory device using the invention, some write drivers and access circuitry for writing to multilevel memory and some separate circuits for writing to bilevel memory will be provided. These will then be used as needed based on the memory allocation.

During reading, it is possible to provide different reading circuits (sense amplifiers) for the multilevel array and for the bilevel array, so as to optimize each reading circuit, on the basis of the array associated with it. As an alternative, it is possible to use the same reading circuits both for the multilevel array and for the bilevel array, using a single reference for reading the cells of the bilevel array, such as to distinguish between the first and the last distribution.

As far as addressing of the cells of the multilevel array and of the bilevel array is concerned, it is possible to use two different solutions. A first solution includes allocating some of the general addresses to the cells of the bilevel array; in this case, reading of the bilevel array can be carried out using the same methods as for reading the multilevel array. A second solution includes allocating appropriate addresses to the cells of the bilevel array; in this case, reading the cells of the bilevel array requires a specific operation, such as generation of an own signal, for example for defining a further bit associated with the addressing words, thereby expanding the usable space. As an alternative, use can be made of a suitable command, that specifies which of the two arrays is to be read.

The memory device according to the invention can be configured as required, both concerning which of the two arrays must function as bilevel (or generically with Nbits), and which must function as multilevel (or generically with Mbits, in which N≠m) and concerning selection of the number of levels that must be stored in each specific part of the memory. For example, as technology progresses, it may be desired to have N equal 2, 3 or 4 and M equal 6, 7, 8 or higher. Currently, it is preferred to have N equal 1 and M equal a number above 1. In addition, if the same reading circuits are provided, and the two parts of the memory define a single array, the dimensions of each part of the memory can be configured as desired according to the design.

The configuration can take place by virtue of an external command by the user, or using a nonvolatile configuration memory (for example a flash memory), storing the information regarding the number of parts into which the memory is divided, the dimensions of each part, and the number of bits which can be stored in each part. For example, with a 16 Mbit memory, 8 Mbits can be allocated for storing Nbits per cell (for example n=1), and 8 Mbits can be configured with Mbits per cell (for example m=2 or 3 or 4), using a configuration flash memory.

Examples of architectures of the memory device according to the invention, based on the preceding considerations, are now described in more detail.

Figure 3:
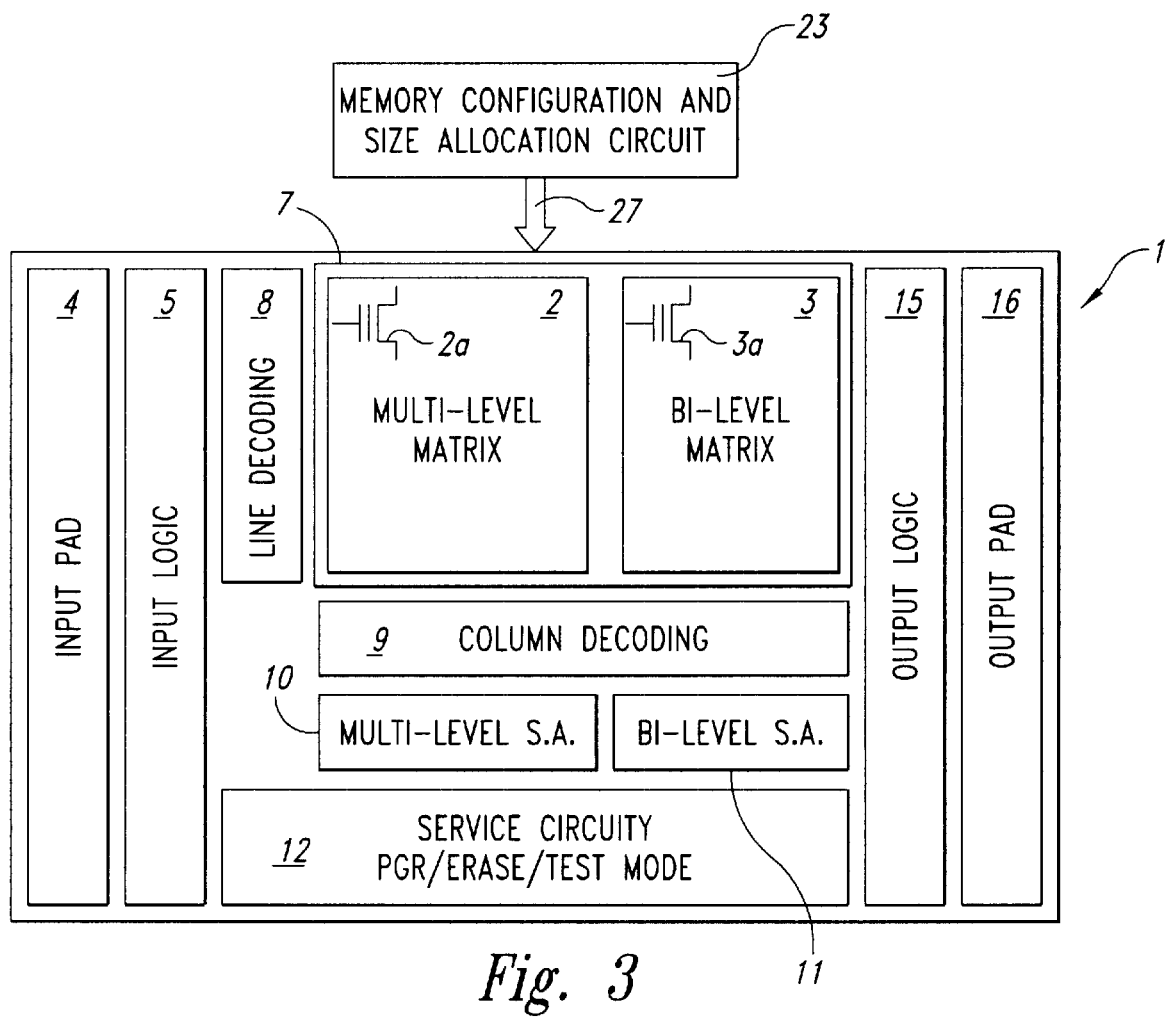
FIG. 3 shows the architecture of a first embodiment of a memory device according to the invention.

FIG. 3 relates to a memory device 1 comprising a memory array having a multilevel array 2 and a bilevel array 3, which have suitable reading circuits, optimized according to the number of levels stored in each cell for the respective portions of the array, in a known manner.

The multilevel array 2 can for example comprise 56 Mbits, and the bilevel array 3 can for example comprise 8 Mbits; the respective and general dimensions can however differ according to design requirements.

In detail, the memory device 1 comprises an input area 4, accommodating input pads, and connected, in a known manner, not shown, to an input logic circuit 5. In turn, and in a known manner, the input logic circuit 5 is connected to a row decoding circuit 8, to a single column decoding circuit 9, to a multilevel reading circuit (multilevel sense amplifiers) 10, to a bilevel reading circuit (bilevel sense amplifiers) 11, and to service circuitry 12, including circuits necessary for performing programming, erasing and testing. The column decoding circuit 9 is in this case common both to the multilevel array 2, and to the bilevel array 3. The multilevel 10 and bilevel 11 reading circuits are connected to an output logic circuit 15, which in turn is connected to an output area 16, accommodating output pads.

In the memory device 1 in FIG. 3, therefore, the multilevel reading circuit 10 and of the bilevel reading circuit 1 are selectively enabled, depending on whether cells 2a belonging to the multilevel array 2, or cells 3a belonging to the bilevel array 3 are to be read. In addition, the addresses of the cells of the multilevel array 2 and of the bilevel array 3 are different from one another, and addressing takes place in a conventional manner through the column decoding circuit 9, which allows selection of a multilevel cell 2a or a bilevel cell 3a, according to the address received from the input logic circuit 5.

Figure 4:
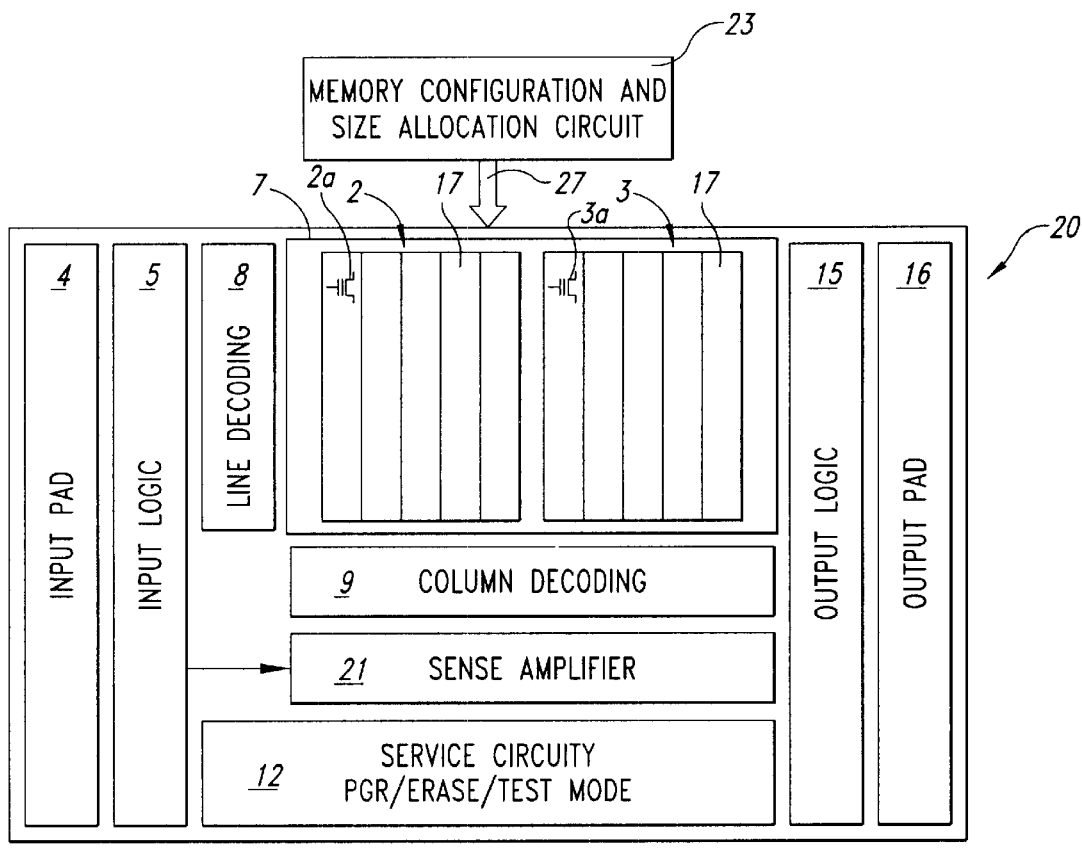
FIG. 4 shows the architecture of a second embodiment of a memory device according to the invention.

FIG. 4 shows a memory device 20 provided with a single reading circuit 21 associated with the entire memory array 7, the same one being used for both with the multilevel array 2, and with the bilevel array 3. In this case, the input logic 5 can send a suitable signal to the reading circuit 21, such that, during reading of the cells 3a of the bilevel array 3, the reading circuit 21 uses a single reference which can distinguish directly between the two states stored by the cells 3a of the bilevel array 3.

A memory array configuration and size allocation circuit is also shown in FIGS. 3 and 4. This is a circuit capable of configuring and allocating the memory array to the various portions that have been described herein. It is coupled to the memory 20 as shown by bus line 27, which may include plural lines coupled to the row decoder, column decoder, sense amplifier, program and erase circuitry, as well as to various portions of the memory array itself. It is capable, under input command from a user, of changing the relative size of the memory portions. A user may, using it, allocate much of the memory, such as 80% to 90%, to high-density multilevel memory and the remainder, 20% to 10%, to the low-density, bilevel or fewer multilevel memory. The user may also configure the same memory array to be of a different allocation, such as 50% of each type or even 20% of the high-density memory and 80% of the low-density memory. Some of the same memory cells can thus be changed, under control of the allocation circuitry 23, to be either multilevel memory matrix 2, or bilevel matrix 3.

In one embodiment, the memory array 7 is divided into sectors 14. In the embodiment of FIG. 4, there are nine sectors 14, through other numbers of sectors can be used. The user has configured the sectors 14 to have five of the sectors in the high-density portion 2 and four sectors of memory in the low-density portion 3. The user is free to configure each sector into either portion of the array, as they prefer. The user can configure the array 7 to have all sectors 14 in the high-density memory and no sectors in the low-density memory so that low-density array 3 has no memory cells.

The user may also configure all sectors to be bilevel arrays or some other low-density array and have not sectors in the high-density portion 2. The ability to move cells to be in different portions of the memory, including moving individual columns or entire sectors, from one portion of the array 7 to another is done under control of the user in the other embodiments shown in FIGS. 3 and 5.

Furthermore, the user can configure the number of bits to be stored in each cell. The user may have 2, 3, or more bits stored in each cell of high-density portions 2 and 1, 2 or more bits stored in low-level portions 2, 3. The sense amplifier circuits 21 can then be configured to sense the proper number of bits. For example, some of the sense amps 21 that would be used with the portion 3 may be used instead with the portion 2 if more are required as may be the case with a high-density memory, even if the same number of cells are in each array. Thus, the user can have the high-density array and sense amplifier configuration to store four bits in the high-density array 2 and two bits in the low-density array 3. At a later time, the user may configure the memory to store only three bits in the high-density portion 3. Since the memory configuration circuit 23 is also coupled to switches that control access to the sense amplifier circuitry 21 and its configuration, the appropriate connections can be made at the sense amplifier 21 for the number of bits being sensed, as well as for the number of sectors in each portion. For example, three sense amplifiers could be allocated to sense the value of two or more bits in a single memory cell if desired or the same three sense amplifiers could be allocated to sense three different bit storage memory cells in the low-density portion 3.

In one embodiment, the memory device 20 is not a standalone device. Instead, it is on-board memory with a microprocessor or other CPU, such as a smart card chip. It thus has no input pads 4 or output pads 16 and instead has only the appropriate input and output logic to interface wit the CPU. The invention is useful with a smart card or other systems having an internal CPU. Such a CPU can be used with the configuration logic 23 to make it easier for the user to configure the memory while the chip is installed within a system, if desired.

This memory configuration and allocation circuitry is shown coupled to the embodiments of FIGS. 3 and 4. It can also be coupled to and used with the embodiments of FIG. 5.

Figure 5:
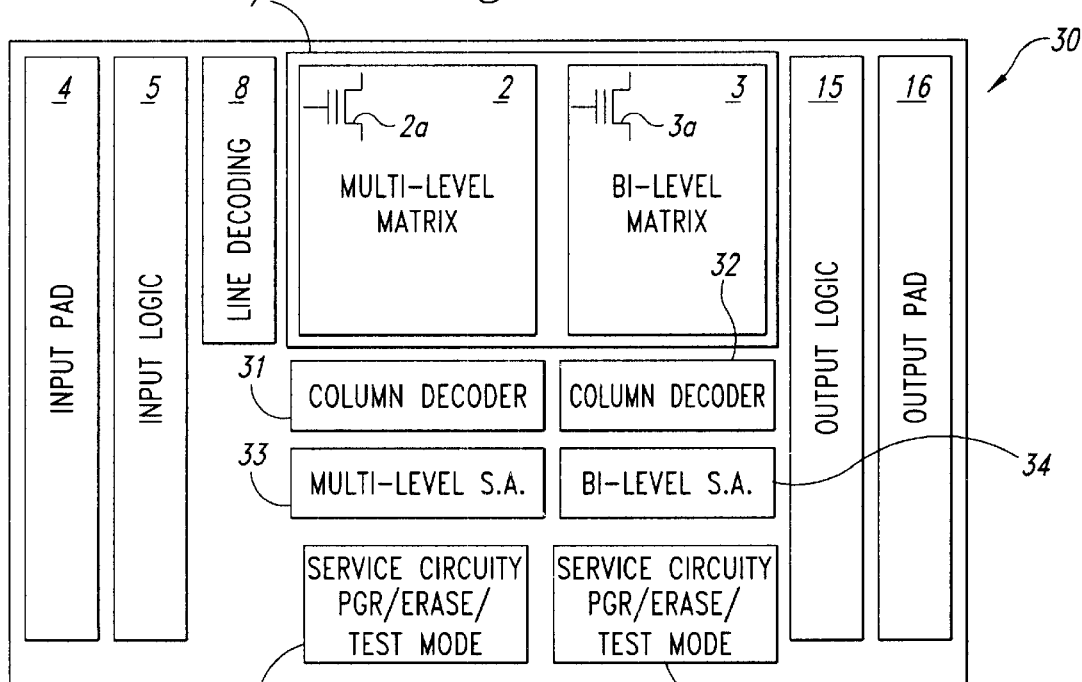
FIG. 5 shows the architecture of a third embodiment of a memory device according to the invention.

FIG. 5 shows a memory device 30 wherein the addresses of the cells 2a of the multilevel array 2 and of the cells 3a of the bilevel array 3 belong to two different spaces. In particular, in FIG. 5, each array 2, 3 is associated with a respective column decoder 31, 32, and with a respective reading circuit 33, 34, and addressing of the multilevel array 2 or of the bilevel array 3 is carried out using a further addressing bit, as shown in greater detail in the diagram in FIG. 6, which depicts only some of the blocks of FIG. 5 and the respective connections.

Figure 6:
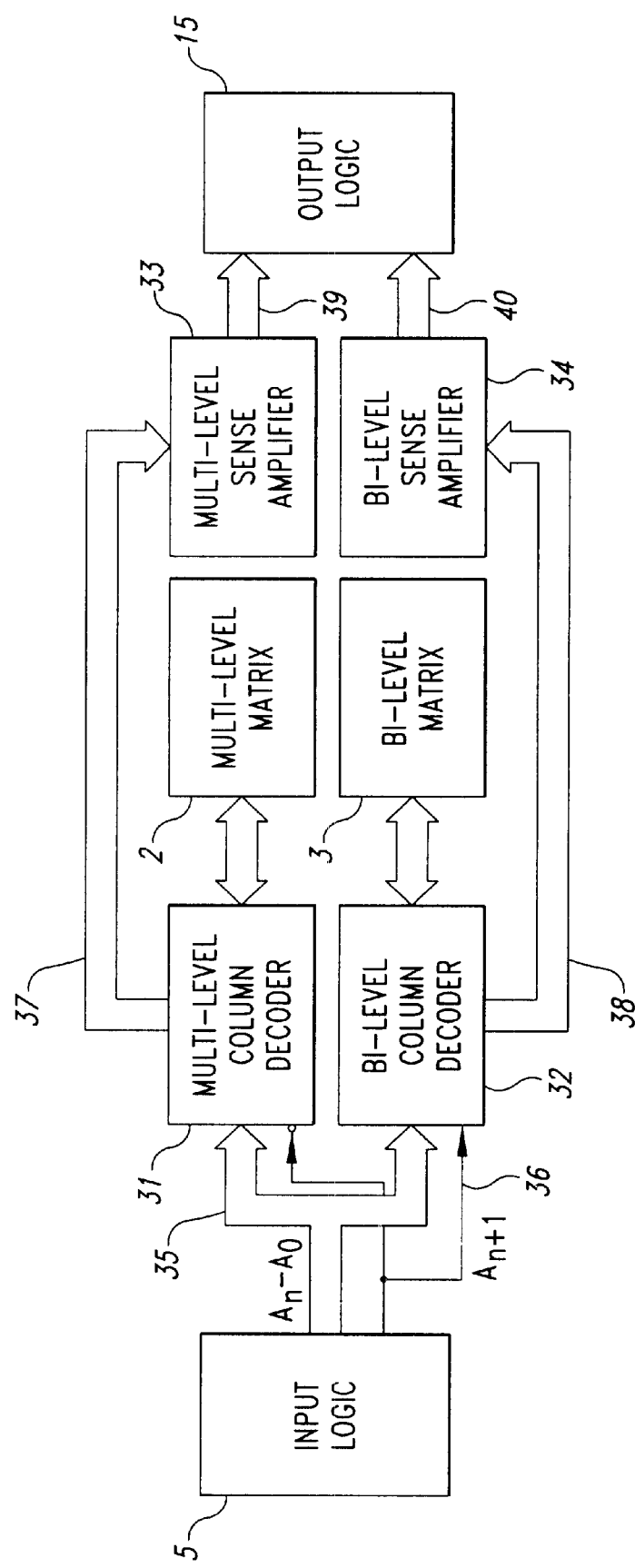
FIG. 6 shows a detail circuit portion of FIG. 5.

In detail, in FIG. 6, the input logic circuit 5 transmits n+1 address bits (address signals An–Ao supplied to an address bus 35), both to the multilevel column decoder 31, and to the bilevel column decoder 32. In addition, the input logic circuit 5 sends an enable/disable signal to the multilevel 31 and bilevel 32 column decoders (address signal An+1 supplied to a line 36 and causing enabling of a single one of the two column decoders 31, 32).

The multilevel column decoder 31 is then connected only to the multilevel array 2; the bilevel column circuit 32 is connected only to the bilevel array 3. In addition, the multilevel column decoder 31 is connected to the respective multilevel reading circuit 33 through a respective multilevel bus 37, and the bilevel column decoder 32 is connected to the respective bilevel reading circuit 34 through a respective bilevel bus 38; finally, both the reading circuits 33 and 34 are connected to the output logic circuit 15 via respective buses 39, 40.

As an alternative, the column decoder can be common to both the multilevel 2 and bilevel 3 arrays, such as to address simultaneously columns with the same address in the multilevel array 2 and in the bilevel array 3, and the input logic circuit 5 can generate a selective enable signal for one or the other of the arrays 2, 3, such as to allow reading of a single one of the two arrays 2, 3 at a time.

In both cases, since the multilevel array 2 is generally much larger than the bilevel array 3, when the bilevel array 3 is addressed, the addresses actually supplied to the address bus 35 are a subassembly of all the possible addresses; on the other hand, when the multilevel array 2 is addressed, it is possible to use all the addresses possible.

The advantages of the described memory device are apparent from the foregoing description. In particular, the fact is emphasized that it allows both rapid and reliable reading of part of the memory, for which reading speed and reliability are of particular importance, and also the storing of a large quantity of data, for which a particular reading speed is not required, but, on the other hand, the reduction of dimensions, and thus of the storage costs, is more important. In practice, the present memory device makes it possible to meet conflicting requirements existing in some memories with a large storage capacity, by providing two separate memory areas, each selected relative to the requirements for speed and information storage density, according to the needs. The selection of which portion stores N bits and which stores M bits, and the size of the memory areas, can be made during the manufacturing stage by the maker or at a customer's request. Alternatively, it can be made by the user, after the chip has been completed and shipped. The dimensions of the multilevel array 2 and of the bilevel array 3 can thus be selected according to specific applications and requirements of the client during the configuration stage, thus providing a high flexibility in relation to the above-described characteristics.

Finally, it is apparent that many modifications and variants can be made to the memory device described and illustrated, all of which come within the scope of the invention, as defined in the attached claims. In particular, the invention can also be applied to other types of nonvolatile memories, for example EPROM memories. In addition, the invention also covers memory devices provided with two or more multilevel memories with different storage densities; for example, as well as or instead of a bilevel array, the memory device can comprise a memory array with two bits, and a memory array with three or four bits.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A nonvolatile memory device, having a memory area comprising:
    a plurality of memory cells in which said memory area has at least first and second memory parts of different storage capacity whose size can be selectively changed by circuitry within the memory device itself each part including memory cells for storing a different number of bits; and
    a plurality of memory sectors that form the first and second memory parts, wherein memory cells in a same memory sector store a same number of bits.

2. The device according to claim 1 wherein said first memory part is a multilevel array having memory cells, each of which stores more than one information bit, and said second memory part is a bilevel array having memory cells, each of which stores one information bit.

3. The device according to claim 2 wherein each said memory cell of said first memory part stores two information bits.

4. The device according to claim 2 wherein said first memory part has more columns of memory cells than said second memory part.

5. The device according to claim 2 wherein said first memory part comprises code storing means.

6. The device according to claim 2 wherein said second memory part comprises means for performing at least one of boot and cache storing operations.

7. The device according to claim 1, further including at least a first and a second reading circuit connected respectively to said first and to said second memory parts, said first reading circuit being configured for reading a first number of bits, and said second reading circuit being configured for reading a second number of bits, different from said first number of bits.

8. The device according to claim 1, further including a single reading circuit, connected to both said first and said second memory parts.

9. The device according to claim 1, further including a single column decoding circuit, which, each time, addresses selectively only memory cells belonging to said first memory part or to said second memory part.

10. The device according to claim 7, further including a first and a second column decoding circuit, connected respectively to said first and to said second memory parts, and to said first and to said second reading circuit.

11. The device according to claim 10, further including an addressing logic circuit, having a plurality of first addressing outputs connected to said first and to said second column decoder, and at least a second enabling/disabling output, connected to said first and second column decoder for selective enabling said first or said second column decoding circuit.

12. A method for storing information coded as information bits in a nonvolatile memory, the method comprising:
    storing a first number of information bits of a first type in a memory cell of a first memory portion of said nonvolatile memory; and
    storing a second number of information bits of a second type in a memory cell of a second memory portion of said nonvolatile memory, said second number of bits being different from said first number of bits, wherein memory cells in each of the first and second memory portions store a same number of information bits, of the first or second types respectively, as other memory cells in their same memory portion.

13. The method according to claim 12 wherein said first number of bits is at least two, and said first memory portion comprises a multilevel memory array, and in that said second number of bits is one, and said second memory portion comprises a bilevel memory array.

14. The method according to claim 12, further including selecting said first and said second number of bits.

15. The method according to claim 12, further including selecting the dimensions of said first memory portion and said second memory portion.

16. A memory array, comprising:
    a first memory portion having memory cells programmed for storing a first number of bits;
    a second memory portion having memory cells configured for storing a second number of bits;
    memory cell access circuitry that is common to both the first memory portion and the second memory portion; and
    memory configuration and size circuitry coupled to the first and second memory portions to allow user-selective change of sizes of the memory portions.

17. The memory array of claim 16 wherein the access circuitry that is common to both memory portions includes row decoding circuitry.

18. The memory array of claim 16 wherein the access circuitry that is common to both memory portions includes column decoding circuitry.

19. The memory array of claim 16 wherein the access circuitry that is common to both memory portions includes sense amplifier circuitry.

20. The memory array of claim 16 wherein the access circuitry that is common to both memory portions includes program and erase control circuitry.

21. The memory array of claim 16 wherein the access circuitry that is common to both memory portions includes output logic circuitry.

22. The memory array of claim 16 wherein the access circuitry that is common to both memory portions includes output pad circuitry.

23. The memory array of claim 16 wherein memory cells in the first memory portion are configured to store 1 bit and memory cells in the second memory portion are configured to store 2 bits.

24. A memory array, comprising:

a first memory array portion having memory cells configured for outputting a first number of bits;

a second memory array portion having memory cells configured for outputting a second number of bits;

memory configuration and size allocation circuitry connected to the memory array portions for selectively changing a size of the first memory array portion and the second memory array portion; and separate memory access circuitry for each of the first and second memory array portions.

25. The memory array of claim 24 wherein said memory configuration and size allocation circuitry allocates a plurality of memory cells alternatively to the first memory array portion or to the second memory array portion.

26. The memory array of claim 24, further including:

memory access circuitry that is common to both the first memory array portion and the second memory array portion.

27. The memory array of claim 24, further including:

a connection from the configuration and size allocation circuitry to sense amplifier circuitry to selectively couple a sense amplifier for sensing data from the first memory array portion or the second memory array portion.

* * * * *